(12) United States Patent
Hong et al.

(10) Patent No.: US 10,714,577 B2
(45) Date of Patent: Jul. 14, 2020

(54) ETCH STOP LAYER FOR USE IN FORMING CONTACTS THAT EXTEND TO MULTIPLE DEPTHS

(71) Applicant: GLOBALFOUNDRIES Inc., Grand Cayman (KY)

(72) Inventors: Wei Hong, Clifton Park, NY (US); Hui Zang, Guilderland, NY (US); Hsien-Ching Lo, Round Rock, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 77 days.

(21) Appl. No.: 16/149,711

(22) Filed: Oct. 2, 2018

(65) Prior Publication Data

US 2020/0105886 A1    Apr. 2, 2020

(51) Int. Cl.
*H01L 29/417*    (2006.01)
*H01L 29/06*    (2006.01)
(Continued)

(52) U.S. Cl.
CPC .... *H01L 29/41783* (2013.01); *H01L 21/0217* (2013.01); *H01L 21/0273* (2013.01); *H01L 21/02164* (2013.01); *H01L 21/31053* (2013.01); *H01L 21/31116* (2013.01); *H01L 21/31144* (2013.01); *H01L 21/76283* (2013.01); *H01L 21/76802* (2013.01); *H01L 21/76829* (2013.01); *H01L 21/76832* (2013.01); *H01L 21/84* (2013.01); *H01L 27/1207* (2013.01); *H01L 29/0649* (2013.01); *H01L 29/0847* (2013.01); *H01L 21/0228* (2013.01); *H01L 21/02181* (2013.01); *H01L 21/02271* (2013.01); *H01L 21/02274* (2013.01); *H01L 21/02532* (2013.01); *H01L 21/28035* (2013.01); *H01L 21/28194* (2013.01); *H01L 21/28525* (2013.01); *H01L 29/165* (2013.01); *H01L 29/4933* (2013.01); *H01L 29/517* (2013.01); *H01L 29/6656* (2013.01); *H01L 29/7843* (2013.01)

(58) Field of Classification Search
None
See application file for complete search history.

(56) References Cited

U.S. PATENT DOCUMENTS 6,060,349 A * 5/2000 Peng ................. H01L 27/10844
257/E21.646
9,425,189 B1   8/2016 Moll et al.
(Continued)

*Primary Examiner* — Erik Kielin
(74) *Attorney, Agent, or Firm* — Thompson Hine LLP

(57) ABSTRACT

Structures for a field-effect transistor and methods for fabricating a structure for a field-effect transistor. First and second device structure are respectively formed in first and second device regions, and a first dielectric layer is formed over the first and second device regions. The first dielectric layer includes a recess defining a step at a transition between the first and second device regions, and a second dielectric layer is arranged within the recess in the first dielectric layer. A third dielectric layer is arranged over the first dielectric layer in the first device region and over the second dielectric layer in the second device region. A contact, which is coupled with the second device structure, extends through the first, second, and third dielectric layers in the second device region.

20 Claims, 8 Drawing Sheets

(51) Int. Cl.
*H01L 29/08* (2006.01)
*H01L 27/12* (2006.01)
*H01L 29/51* (2006.01)
*H01L 29/49* (2006.01)
*H01L 29/165* (2006.01)
*H01L 29/78* (2006.01)
*H01L 21/84* (2006.01)
*H01L 21/02* (2006.01)
*H01L 21/768* (2006.01)
*H01L 21/311* (2006.01)
*H01L 21/3105* (2006.01)
*H01L 21/762* (2006.01)
*H01L 21/027* (2006.01)
*H01L 21/28* (2006.01)
*H01L 21/285* (2006.01)
*H01L 29/66* (2006.01)

(56) References Cited

U.S. PATENT DOCUMENTS

| | | | |
|---|---|---|---|
| 9,608,112 B2 | 3/2017 | Smith et al. | |
| 2009/0096036 A1* | 4/2009 | Ishigaki | H01L 21/82341 |
| | | | 257/392 |
| 2010/0181549 A1* | 7/2010 | Kim | H01L 27/2409 |
| | | | 257/3 |
| 2011/0186929 A1* | 8/2011 | Heinrich | H01L 27/1207 |
| | | | 257/350 |
| 2013/0087855 A1* | 4/2013 | Makiyama | H01L 21/84 |
| | | | 257/350 |
| 2015/0364490 A1* | 12/2015 | Oda | H01L 21/26513 |
| | | | 257/351 |
| 2018/0294269 A1* | 10/2018 | Feng | H01L 27/10894 |
| 2019/0088656 A1* | 3/2019 | Kim | H01L 43/08 |
| 2019/0206744 A1* | 7/2019 | Maruyama | H01L 21/84 |

* cited by examiner

ETCH STOP LAYER FOR USE IN FORMING CONTACTS THAT EXTEND TO MULTIPLE DEPTHS

BACKGROUND

The invention relates generally to semiconductor devices and integrated circuit fabrication and, in particular, to structures for a field-effect transistor and methods for fabricating a structure for a field-effect transistor.

Complementary-metal-oxide-semiconductor processes may be used to build a combination of p-type and n-type field-effect transistors that are used to construct, for example, logic cells. Field-effect transistors generally include a channel region, a source, a drain, and a gate electrode. When a control voltage exceeding a characteristic threshold voltage is applied to the gate electrode, carrier flow occurs in the channel region between the source and drain to produce a device output current.

Field-effect transistors fabricated using semiconductor-on-insulator technologies may exhibit certain performance improvements in comparison with comparable field-effect transistors built directly in a bulk silicon substrate. Generally, a silicon-on-insulator (SOI) wafer includes a thin device layer of semiconductor material, a substrate, and a thin buried insulator layer, such as a buried oxide layer, physically separating and electrically isolating the device layer from the substrate. Contingent on the thickness of the device layer, a field-effect transistor may operate in a fully-depleted mode (FDSOI) in which the channel region reaches fully across the device layer to the buried insulator layer when typical control voltages are applied to the gate electrode.

In certain instances, the device layer and buried insulator layer may be removed to expose the substrate over a hybrid region of the SOI wafer and a field-effect transistor may be fabricated using the exposed substrate in the hybrid region. Due to the localized removal of the device layer and buried insulator layer, the field-effect transistor in the hybrid region is recessed in elevation relative to field-effect transistors formed using the device layer. This elevation differential may lead to difficulties when etching openings for contacts in an overlying interlayer dielectric layer. Specifically, during the overetch, unbalanced etch loading can locally widen the shallower contact openings proximate to the source/drain regions of the field-effect transistors formed using the device layer, which may eventually lead to shorting or premature dielectric breakdowns.

Improved structures for a field-effect transistor and methods for fabricating a structure for a field-effect transistor are needed.

SUMMARY

In an embodiment of the invention, a structure includes a first device structure in a first device region, a second device structure in a second device region, and a first dielectric layer over the first device region and the second device region. The first dielectric layer includes a recess defining a step at a transition between the first device region and the second device region, and a second dielectric layer is arranged within the recess in the first dielectric layer. A third dielectric layer is arranged over the first dielectric layer in the first device region and over the second dielectric layer in the second device region. A first contact extends through the first dielectric layer, the second dielectric layer, and the third dielectric layer in the second device region. The contact is coupled with the second device structure.

In an embodiment of the invention, a method includes fabricating a first device structure in a first device region and a second device structure in a second device region, forming a first dielectric layer over the first device region and the second device region, and recessing the first dielectric layer in the second device region relative to the first device region to form a recess in the first dielectric layer that defines a step at a transition from the first device region to the second device region. After recessing the first dielectric layer, the recess is filled with a second dielectric layer. The method further includes depositing a third dielectric layer on a top surface of the first dielectric layer and a top surface of the second dielectric layer, depositing a fourth dielectric layer over the third dielectric layer, and patterning the fourth dielectric layer to form a contact opening that extends through the fourth dielectric layer to the third dielectric layer in the second device region. The fourth dielectric layer is patterned with an etching process that stops on the third dielectric layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
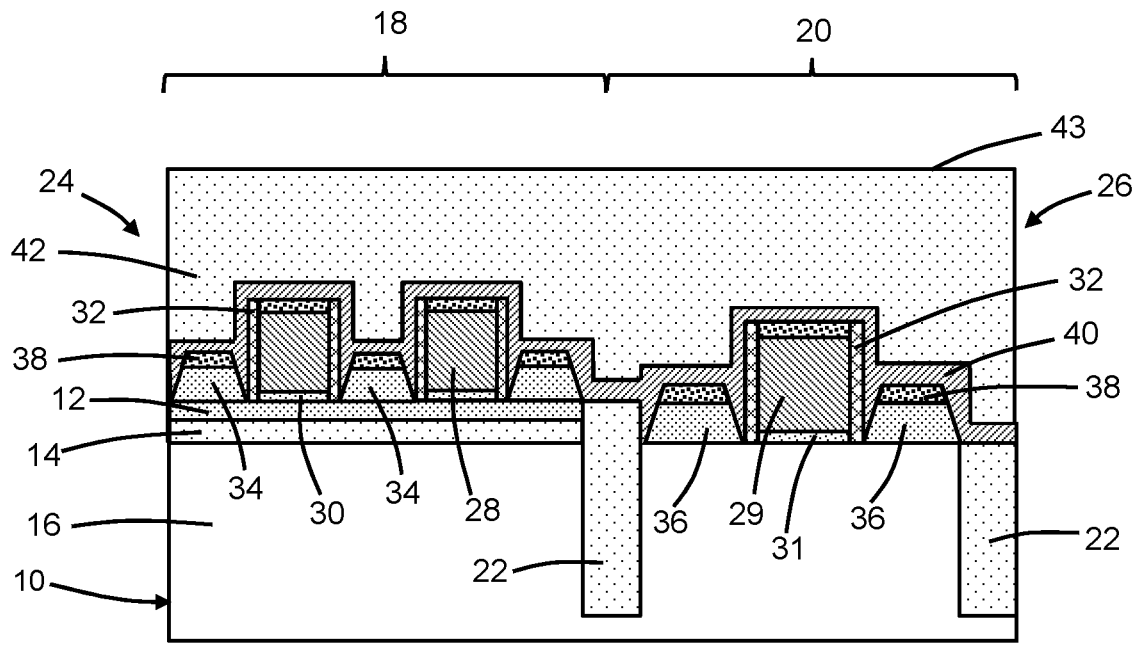
FIGS. 1-10 are cross-sectional views of a structure at successive fabrication stages of a processing method in accordance with embodiments of the invention.

With reference to FIG. 1 and in accordance with an embodiment of the invention, a silicon-on-insulator (SOI) wafer 10 includes a device layer 12, a buried insulator layer 14 that may be composed of an oxide of silicon (e.g., $SiO_2$), and a substrate 16. The device layer 12 and the substrate 16 may be composed of a single-crystal semiconductor material, such as single-crystal silicon (Si). The device layer 12 is separated from the substrate 16 by the intervening buried insulator layer 14 and may be considerably thinner than the substrate 16. In an embodiment, the device layer 12 may have a thickness that ranges from about 3 nanometers (nm) to about 100 nm. In an embodiment, the device layer 12 may have a thickness in an ultra-thin regime (i.e., about 3 nm to about 10 nm) suitable to manufacture fully-depleted SOI devices (FDSOI). The buried insulator layer 14 directly contacts the substrate 16 along an interface and directly contacts the device layer 12 along another interface, and these interfaces are separated by the thickness of the buried insulator layer 14 and may terminate at the outer rim of the silicon-on-insulator wafer 10. The substrate 16 may be lightly doped to have, for example, p-type conductivity.

The device layer 12 and buried insulator layer 14 may be removed in a device region 20, which is arranged adjacent to a device region 18 in which the device layer 12 and buried insulator layer 14 are intact. To that end, an etch mask (not shown) may be formed by lithography in which a photoresist layer is applied, exposed to a pattern of radiation projected through a photomask, and developed to form an opening situated at the intended location for the device region 20. The patterned photoresist layer is used as an etch mask covering the device region during an etching process, such as a reactive-ion etching (ME) process, that removes unmasked portions of the device layer 12 and buried insulator layer 14 to expose the substrate 16 and define the device region 20 of the substrate 16. The etching process may be conducted in a single etching step or multiple etching steps with one or more etch recipes.

Trench isolation regions 22 may be formed by patterning trenches extending through the device layer 12 and buried insulator layer 14 and into the substrate 16 with lithography and etching processes, depositing a dielectric material to fill the trenches, and planarizing and/or recessing the dielectric material. The dielectric material comprising the trench isolation regions 22 may be an oxide of silicon (e.g., silicon dioxide) and/or another electrical insulator deposited by chemical vapor deposition.

Device structures having the representative form of field-effect transistors 24, 26 may be fabricated by complementary metal oxide semiconductor (CMOS) processes during front-end-of-line (FEOL) processing. The field-effect transistor 24 is arranged as a device structure in the device region 18, and the field-effect transistor 26 is arranged as a device structure in the device region 20. The field-effect transistor 24 include gate structures having a gate electrode 28 and a gate dielectric 30, and the field-effect transistor 26 includes a gate structure having a gate electrode 29 and a gate dielectric 31. The gate structures of the field-effect transistor 24 are arranged over respective channel regions in the device layer 12, and the gate structure of the field-effect transistor 26 is arranged over a channel region in the substrate 16. The gate dielectrics 30, 31 may be composed of a high-k dielectric material, such as a hafnium-based dielectric material like hafnium oxide ($HfO_2$) deposited by atomic layer deposition (ALD), and the gate electrodes 28, 29 may be composed of a semiconductor material, such as doped polysilicon, deposited by chemical vapor deposition.

Sidewall spacers 32 are formed adjacent to the sidewalls of the gate structures of the field-effect transistors 24, 26. The sidewall spacers 32 may be formed by depositing a conformal layer composed of a dielectric material, such as silicon dioxide deposited by chemical vapor deposition, and shaping the conformal layer with an anisotropic etching process, such as reactive ion etching.

Raised source/drain regions 34 are formed adjacent to the spacer-clad gate structures of the field-effect transistor 24, and raised source/drain regions 36 are formed adjacent to the spacer-clad gate structure of the field-effect transistor 26. As used herein, the term "source/drain region" means a doped region of semiconductor material that can function as either a source or a drain of a field-effect transistor. The raised source/drain regions 34 contain an epitaxial semiconductor material that is grown by an epitaxial growth process using the crystal structure of the single-crystal semiconductor material of the device layer 12 as a growth template. The raised source/drain regions 36 contain an epitaxial semiconductor material that is grown by an epitaxial growth process using the crystal structure of the single-crystal semiconductor material of the substrate 16 as a growth template. The semiconductor materials constituting the raised source/drain regions 34 and the raised source/drain regions 36 may be, for example, either silicon-germanium (SiGe) or silicon.

A silicide layer 38 may be formed on the gate electrodes 28, 29 and raised source/drain regions 34, 36. The silicide layer 38 may be formed by a silicidation process involving the deposition of a conformal layer of a silicide-forming metal by, for example, chemical vapor deposition or physical vapor deposition, followed by one or more annealing steps (e.g., rapid thermal annealing) to form a silicide phase by reacting the layer of silicide-forming metal and the contacting semiconductor material.

One or more dielectric layers 40 are deposited over the field-effect transistors 24, 26 after the silicide layer 38 is formed. The one or more dielectric layers 40 may include a stress liner composed of a dielectric material, such as silicon nitride, deposited by plasma-enhanced chemical vapor deposition under deposition conditions that cause the dielectric material to be under stress and thereby incorporate either compressive strain or tensile strain. The strain is transferred as stress to the field-effect transistors 24, 26.

An interlayer dielectric layer 42 may be formed over the one or more dielectric layers 40. The interlayer dielectric layer 42 may be composed of an electrically-insulating dielectric material, such as silicon dioxide, that is deposited by chemical vapor deposition and then planarized with chemical-mechanical polishing to provide a planar top surface 43. For example, the interlayer dielectric layer 42 may be composed of an electrically-insulating dielectric material, such as an oxide of silicon, that is deposited and then planarized with chemical-mechanical polishing to provide a planar top surface 43. For example, the dielectric material constituting the interlayer dielectric layer 42 may be silicon dioxide deposited by chemical vapor deposition using ozone ($O_2$) and tetraethylorthosilicate (TEOS) as reactants.

Figure 2:
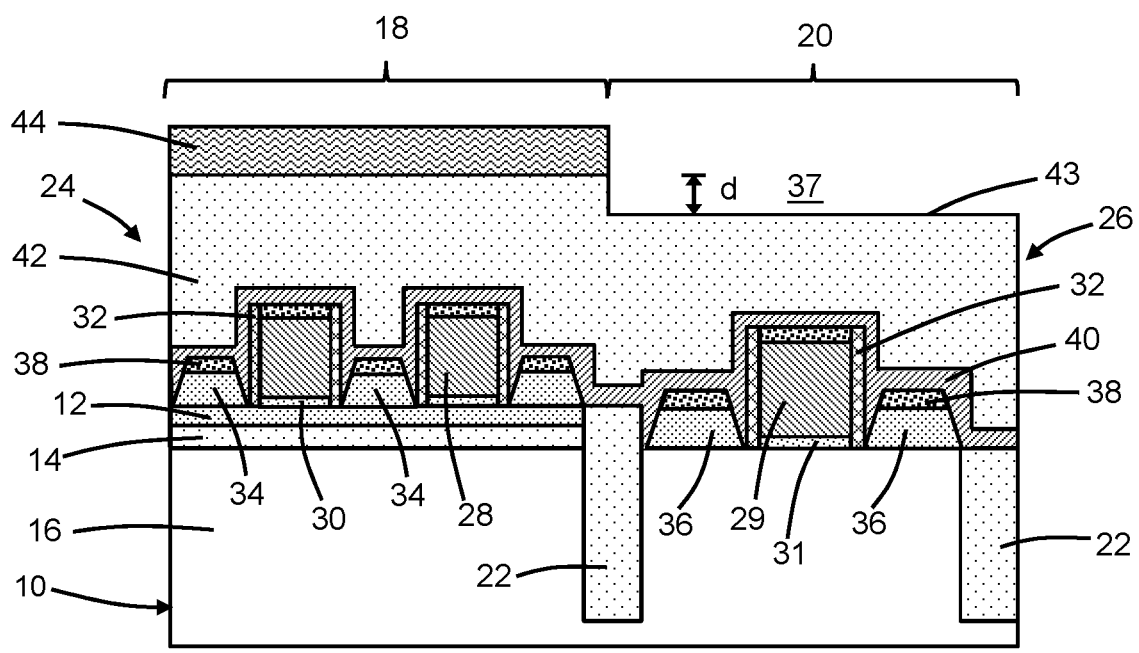

With reference to FIG. 2 in which like reference numerals refer to like features in FIG. 1 and at a subsequent fabrication stage, an etch mask 44 is formed that masks the interlayer dielectric layer 42 over the device region 18 and exposes the interlayer dielectric layer 42 over the device region 20. The etch mask 44 may be formed by a lithography process, and may include a layer of a photosensitive material, such as an organic photoresist, that is applied as a fluid by a spin coating process, pre-baked, exposed to light projected through a photomask, baked after exposure, and developed with a chemical developer.

An etching process is applied to recess the top surface 43 of the interlayer dielectric layer 42 in the device region 20 while the device region 18 is covered and protected by the etch mask 44. Specifically, the top surface 43 of the interlayer dielectric layer 42 in the device region 20 may be recessed by a distance, d, relative to the top surface 43 of the interlayer dielectric layer 42 in the device region 18 to form a recess 37. The top surface 43 of the interlayer dielectric layer 42 in the device region 20 and the top surface 43 of the interlayer dielectric layer 42 in the device region 18 have an elevation difference given by a step height, d, which introduces a step in the interlayer dielectric layer at the transition from the device region 20 to the device region 18. This transition may occur over the trench isolation region 22 arranged between the device region 20 and the device region 18. The etch mask 44 is removed following the etching process.

Figure 3:
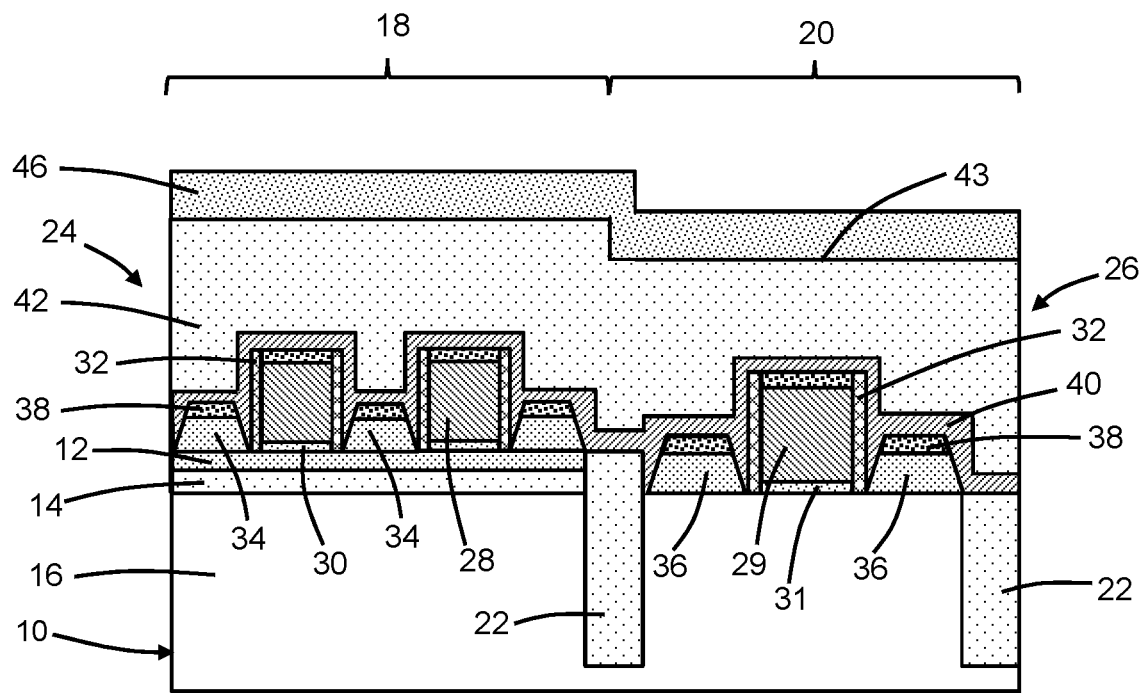

With reference to FIG. 3 in which like reference numerals refer to like features in FIG. 2 and at a subsequent fabrication stage, a dielectric layer 46 is formed over the top surface 43 of the interlayer dielectric layer 42, and conforms to the topography of the top surface 43 of the interlayer dielectric layer 42. The dielectric layer 46 may be composed of a dielectric material, such as silicon nitride, deposited by plasma-enhanced chemical vapor deposition (PECVD). The deposited thickness of the dielectric layer 46 may be greater than or equal to the distance, d (FIG. 2). The dielectric material constituting the dielectric layer 46 may be chosen to have etch selectivity to the dielectric material constituting the interlayer dielectric layer 42.

Figure 4:
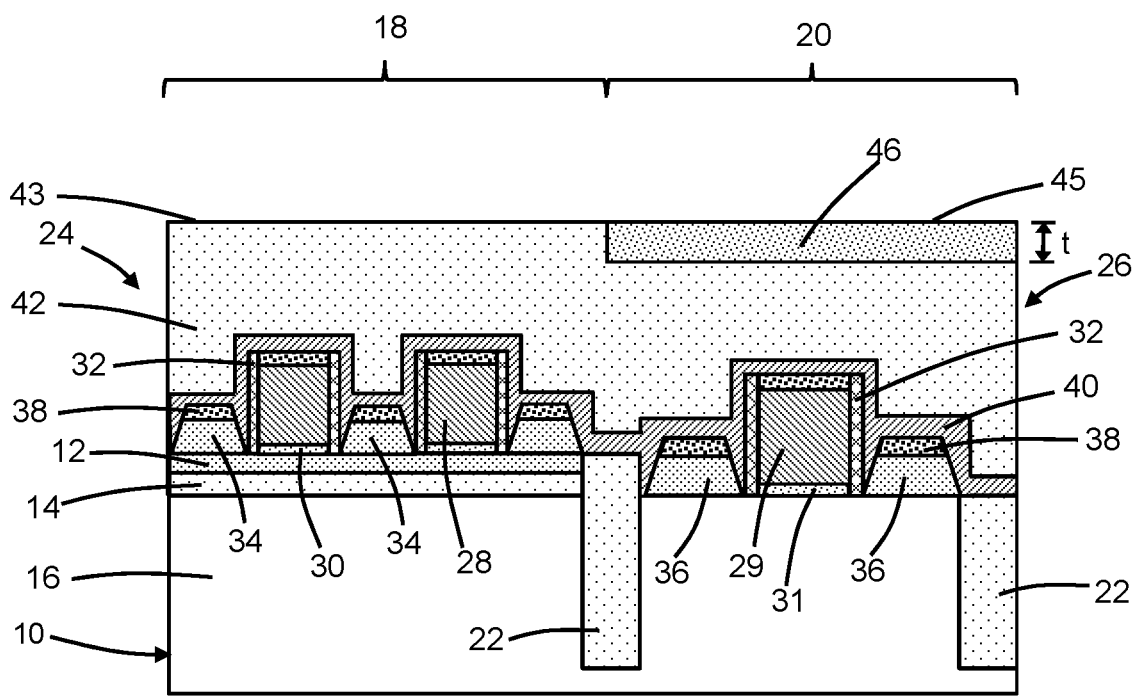

With reference to FIG. 4 in which like reference numerals refer to like features in FIG. 3 and at a subsequent fabrication stage, the dielectric layer 46 is planarized using, for example, chemical mechanical polishing to remove the topography. The dielectric layer 46 may be completely removed from the device region 18 such that the top surface 43 of the interlayer dielectric layer 42 is revealed in device region 18. After planarization, the dielectric layer 46 fills the recess 37 in the interlayer dielectric layer 42 in device region 20 with a given thickness, t, that may be equal to the distance, d (FIG. 2), by which the interlayer dielectric layer 42 is recessed. The dielectric layer 46 compensates for the step height of the interlayer dielectric layer 42 at the transition between the device region 18 and the device region 20, and the remaining thickness of the dielectric layer 46 in the recess 37 is equal or substantially equal to the step height. In an embodiment, the dielectric layer 46 in device region 20 may have a top surface 45 that is coplanar with the top surface 43 of the interlayer dielectric layer 42 in device region 18.

Figure 5:
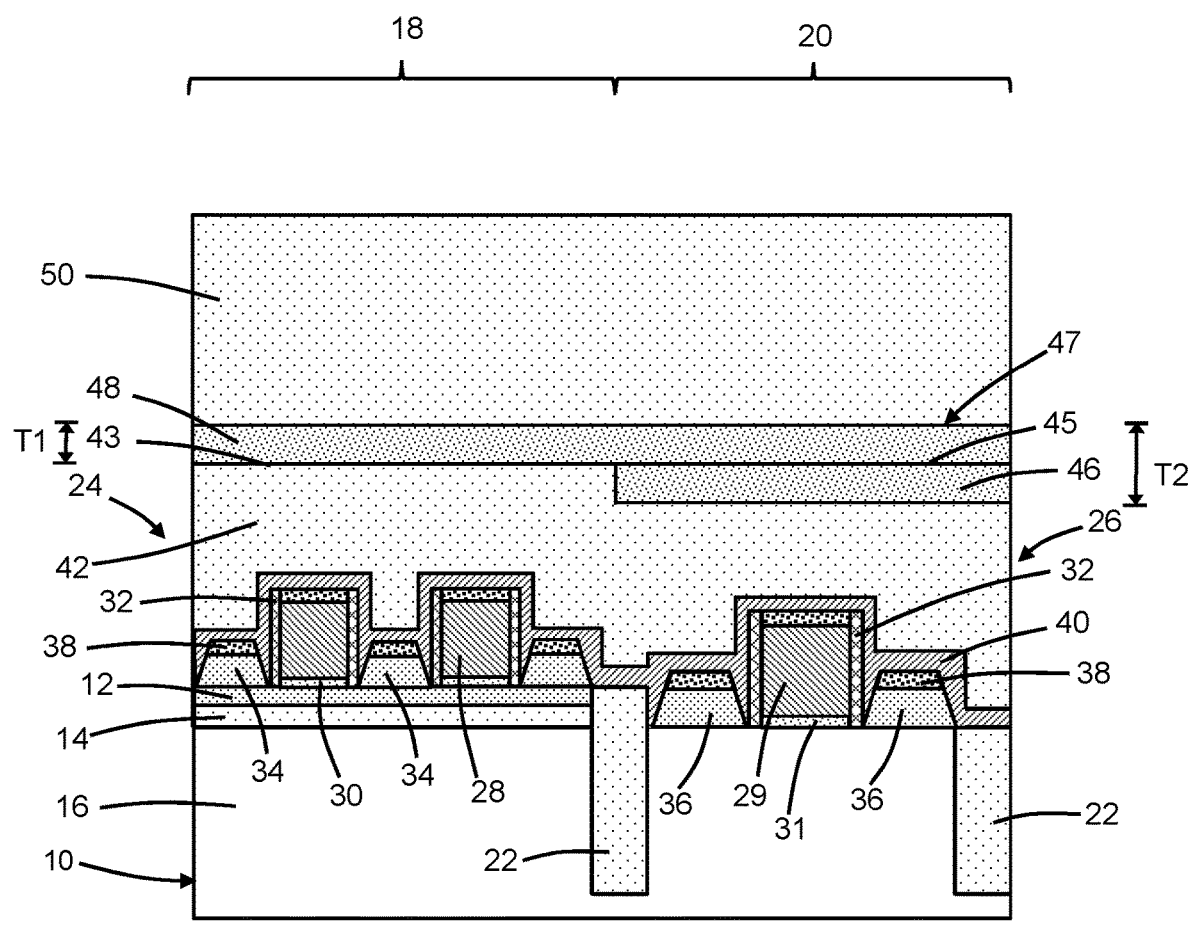

With reference to FIG. 5 in which like reference numerals refer to like features in FIG. 4 and at a subsequent fabrication stage, a dielectric layer 48 is formed over the top surface 43 of the interlayer dielectric layer 42 in device region 18 and the top surface 45 of the dielectric layer 46 in device region 20. The dielectric layer 48 may be composed of a dielectric material, such as silicon nitride, deposited by plasma-enhanced chemical vapor deposition. In an embodiment, the dielectric layer 48 may be composed of the same dielectric material as the dielectric layer 46. The dielectric layer 48 is arranged directly over and directly contacts the interlayer dielectric layer 42 in device region 18, and the dielectric layer 48 is arranged directly over and directly contacts the dielectric layer 46 in device region 20.

An interlayer dielectric layer 50 may be formed over the dielectric layer 48. For example, the interlayer dielectric layer 50 may be composed of an electrically-insulating dielectric material, such as an oxide of silicon, that is deposited by chemical vapor deposition. For example, the dielectric material constituting the interlayer dielectric layer 50 may be silicon dioxide deposited by chemical vapor deposition using ozone ($O_2$) and tetraethylorthosilicate (TEOS) as reactants. The dielectric material(s) constituting the dielectric layer 46 and the dielectric layer 48 may be chosen to exhibit etch selectivity relative to the dielectric material constituting the interlayer dielectric layer 42 and relative to the dielectric material constituting the interlayer dielectric layer 50.

If composed of the same dielectric material, the dielectric layer 46 and the dielectric layer 48 may be considered to collectively constitute a single composite dielectric layer, generally indicated by reference numeral 47. For example, each of the dielectric layers 46, 48 may be composed of silicon nitride such that the thickness, T2, of the composite dielectric layer 47 in device region 20 is greater than the thickness, T1, of the composite dielectric layer 47 in device region 18.

Figure 6:
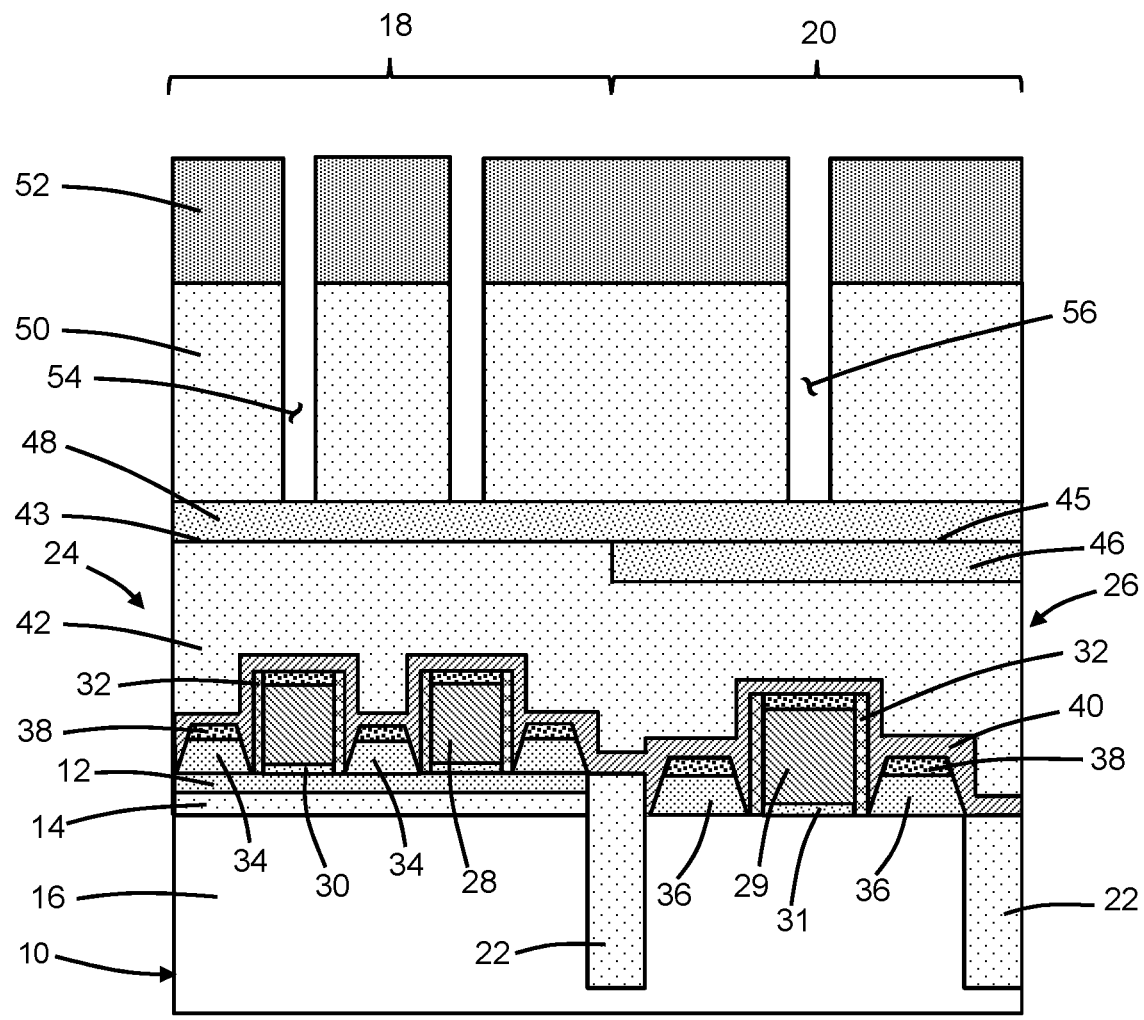

With reference to FIG. 6 in which like reference numerals refer to like features in FIG. 5 and at a subsequent fabrication stage, a spin-on hardmask 52 is formed over the interlayer dielectric layer 50 and patterned with lithography and etching processes to define openings. The spin-on hardmask 52 may be composed of an organic material, for example, an organic planarization layer (OPL) material.

In an initial step of a multiple-step formation process, contact openings 54, 56 are etched in the interlayer dielectric layer 50 with an etching process at the locations of the openings in the spin-on hardmask 52. The contact openings 54, 56 each penetrate in a vertical direction through the interlayer dielectric layer 50 to the dielectric layer 48. The etching process, which may be a reactive ion etching process, removes the material of the interlayer dielectric layer 50 selective to the material of the dielectric layer 48. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The dielectric layer 48 may function as an etch stop for the etching process forming the contact openings 54, 56 in the interlayer dielectric layer 50. In an embodiment, the etching process may be selected to etch silicon dioxide constituting the interlayer dielectric layer 50 selective to silicon nitride constituting the dielectric layer 48.

Figure 7:
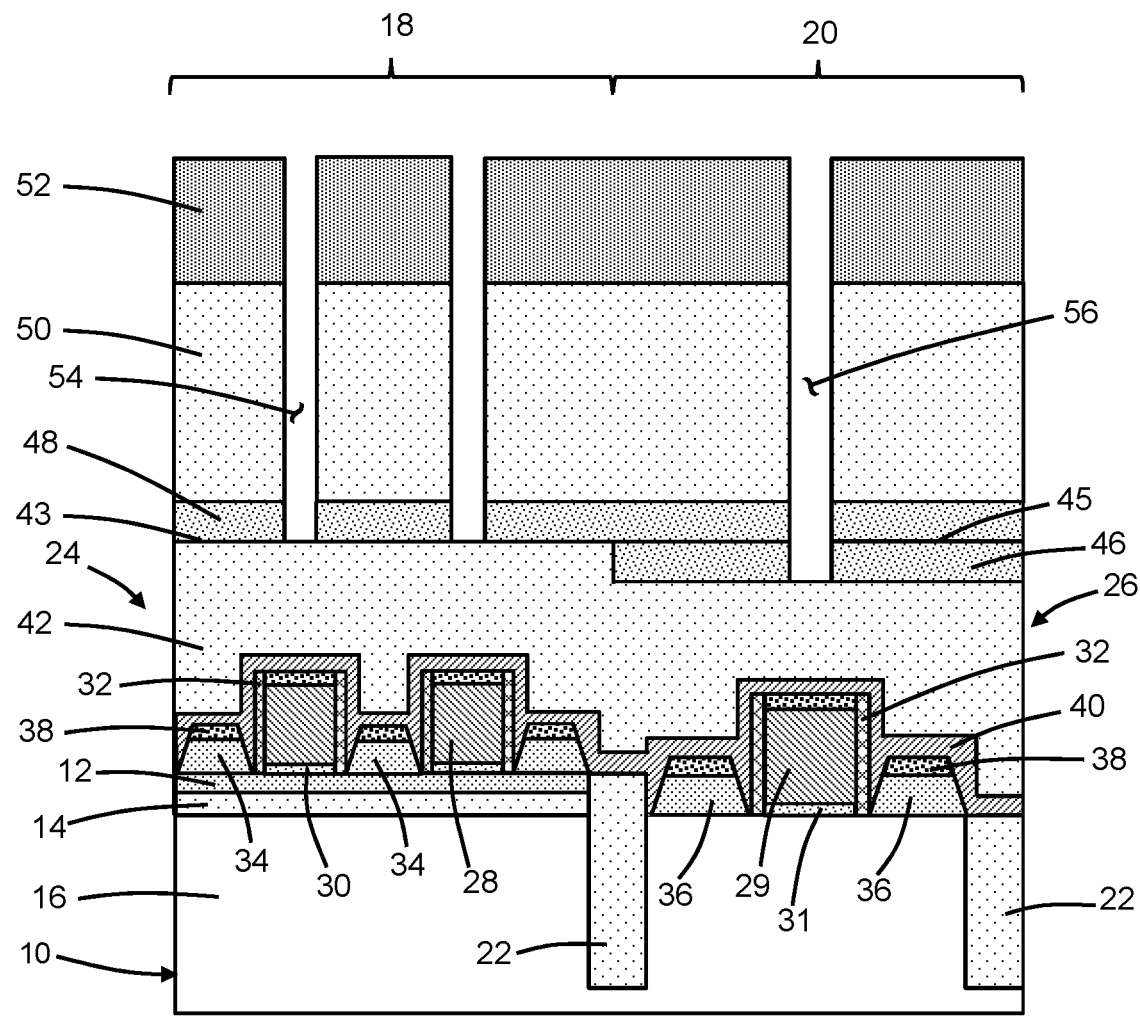

With reference to FIG. 7 in which like reference numerals refer to like features in FIG. 6 and at a subsequent fabrication stage, the contact openings 54, 56 are extended in the vertical direction through the dielectric layer 48 and, in device region 20, through the dielectric layer 46 to the interlayer dielectric layer 42 in a subsequent step of the multiple-step etching process. The etching process, which may be a reactive ion etching process, removes the material of the dielectric layers 46, 48 selective to the material of the interlayer dielectric layer 42. The total thickness of the dielectric layers 46, 48 in device region 20 is greater than the thickness of the dielectric layer 48 alone in device region 18. An overetch may be needed to extend the contact opening 56 through the added thickness of the dielectric layer 46. The interlayer dielectric layer 42 may function as an etch stop for the etching process extending the contact openings 54, 56 through the dielectric layers 46, 48. In an embodiment, the etching process may be selected to etch silicon nitride constituting the dielectric layers 46, 48 selective to silicon dioxide constituting the interlayer dielectric layer 42.

Figure 8:
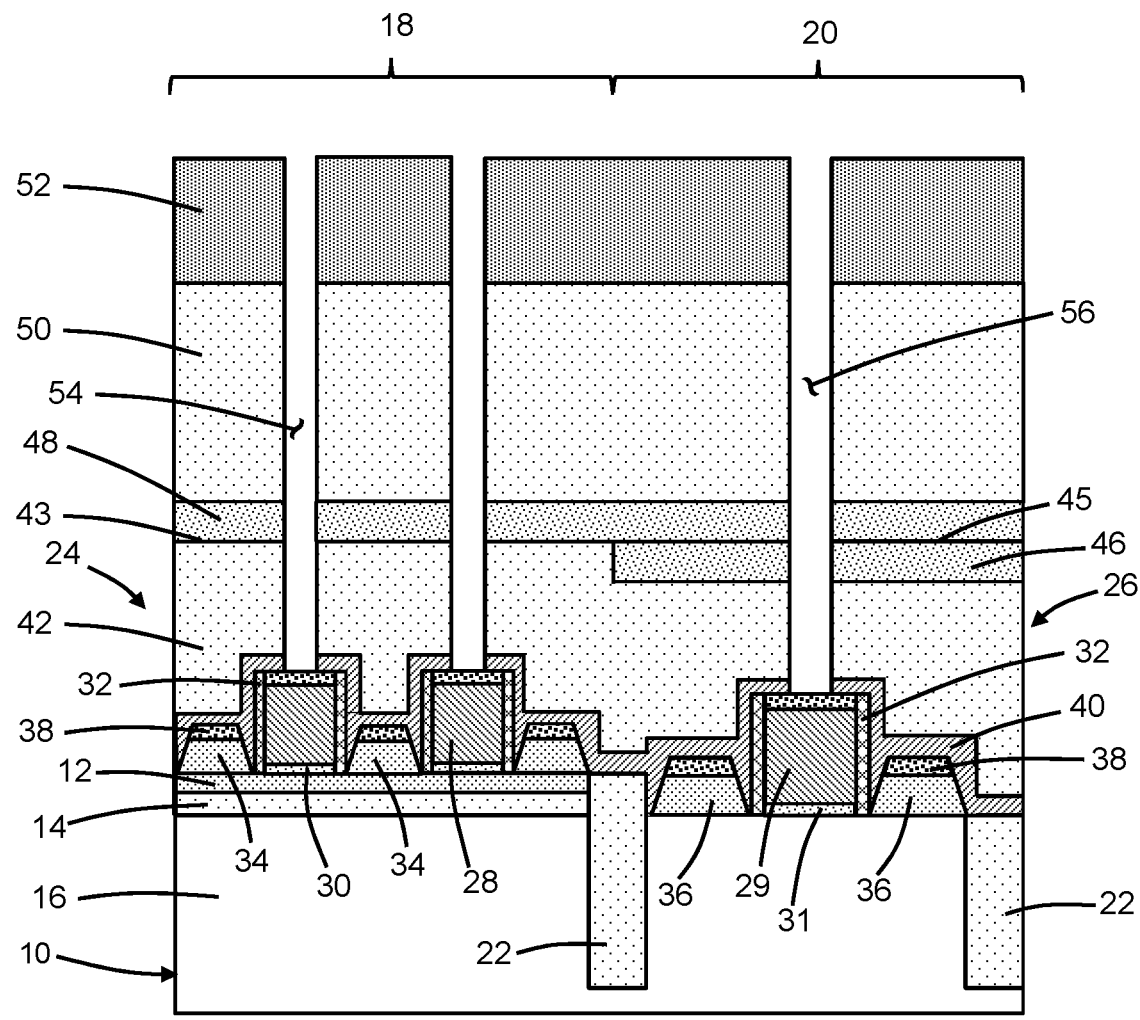

With reference to FIG. 8 in which like reference numerals refer to like features in FIG. 7 and at a subsequent fabrication stage, the contact openings 54 are extended with an etching process to penetrate in a vertical direction through the interlayer dielectric layer 42 and the one or more dielectric layers 40 to the sections of the silicide layer 38 on the gate structures of the field-effect transistor 24 in device region 18. The contact opening 56 is concurrently extended with the same etching process to penetrate in the vertical direction through the interlayer dielectric layer 42 and the one or more dielectric layers 40 to the section of the silicide layer 38 on the gate structure of the field-effect transistor 26 in device region 20. The spin-on hardmask 52 is then stripped.

Figure 9:
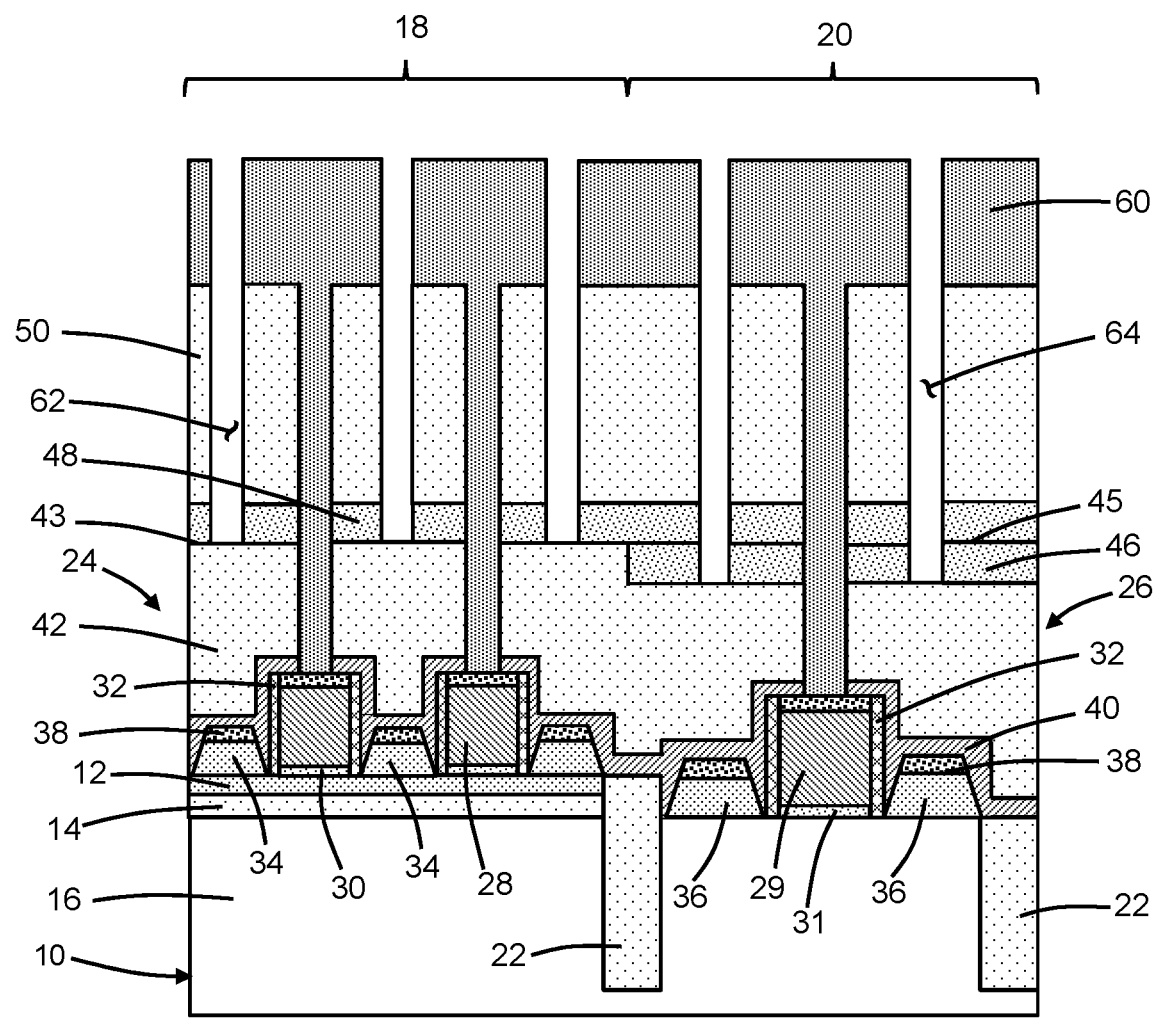

With reference to FIG. 9 in which like reference numerals refer to like features in FIG. 8 and at a subsequent fabrication stage, a spin-on hardmask 60 is formed over the interlayer dielectric layer 50 and patterned with lithography and etching processes to define openings. The spin-on hardmask 60 may be composed of an organic material, for example, an organic planarization layer (OPL) material. Portions of the spin-on hardmask 60 fill the contact openings 54, 56.

Contact openings 62, 64 are formed in a manner similar to the formation of the contact openings 54, 56. In an initial step of a multiple-step etching process, the contact openings 62, 64 are etched in the interlayer dielectric layer 50 with an etching process at the locations of the openings in the spin-on hardmask 60. The contact openings 62, 64 each penetrate in a vertical direction through the interlayer dielectric layer 50 to the dielectric layer 48. The etching process, which may be a reactive ion etching process, that removes the material of the interlayer dielectric layer 50 selective to the material of the dielectric layer 48. The dielectric layer 48 may function as an etch stop. In an embodiment, the etching process may be selected to etch silicon dioxide constituting the interlayer dielectric layer 50 selective to silicon nitride constituting the dielectric layer 48.

The contact openings 62, 64 are then extended in the vertical direction through the dielectric layer 48 and the dielectric layer 46 in device region 20 to the interlayer dielectric layer 42 in a subsequent step of the multiple-step formation process. The etching process, which may be a reactive ion etching process, that removes the material of the dielectric layers 46, 48 selective to the material of the interlayer dielectric layer 42. The total thickness of the dielectric layers 46, 48 in device region 20 is greater than the thickness of the dielectric layer 48 alone in device region 18. An overetch may be needed to extend the contact openings 64 through the added thickness of the dielectric layer 46. The interlayer dielectric layer 42 may function as an etch stop. In an embodiment, the etching process may be selected to etch silicon nitride constituting the dielectric layers 46, 48 selective to silicon dioxide constituting the interlayer dielectric layer 42.

Figure 10:
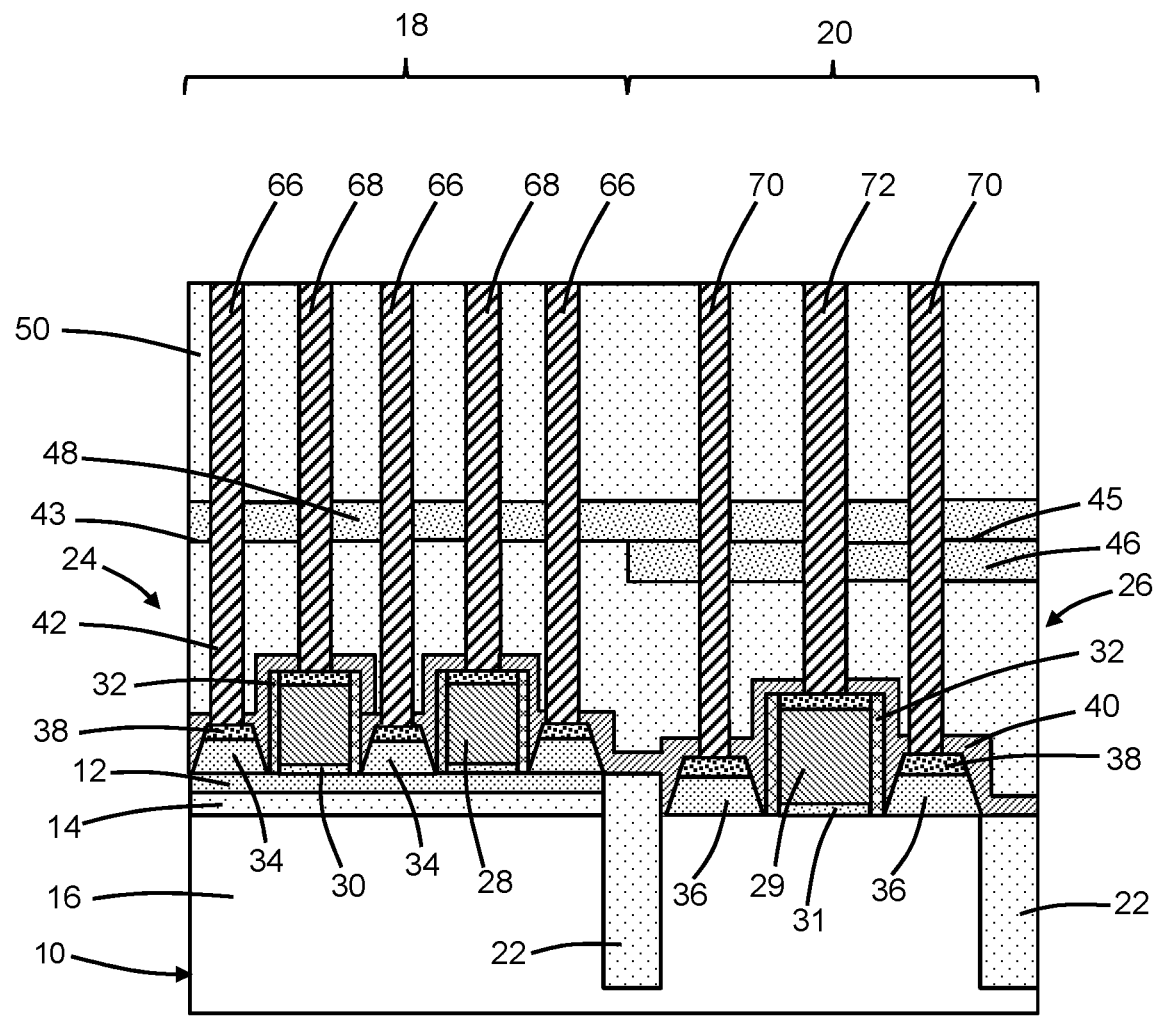

With reference to FIG. 10 in which like reference numerals refer to like features in FIG. 9 and at a subsequent fabrication stage, the contact openings 62 are extended with an etching process to penetrate in a vertical direction through the interlayer dielectric layer 42 and the one or more dielectric layers 40 to the sections of the silicide layer 38 on the raised source/drain regions 34 of the field-effect transistor 24 in device region 18. The contact openings 64 are concurrently extended with the same etching process to penetrate in the vertical direction through the interlayer dielectric layer 42 and the one or more dielectric layers 40 to the section of the silicide layer 38 on the raised source/drain regions 36 of the field-effect transistor 26 in device region 20. The spin-on hardmask 60 is then stripped.

Contacts 66, 68, 70, 72 are respectively formed in the contact openings 54, 56 (FIG. 8) and the contact openings 62, 64 (FIG. 9) by depositing a layer of a conductor, such as tungsten, and planarizing the deposited layer. In device region 18, the contacts 66 are connected with the raised source/drain regions 34 of the field-effect transistor 24, and the contacts 68 are connected with the gate structures of the field-effect transistor 24. In device region 20, the contacts 70 are connected with the raised source/drain regions 36 of the field-effect transistor 26, and the contact 72 is connected with the gate structure of the field-effect transistor 26.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a first field-effect transistor in a first device region;
   a second field-effect transistor in a second device region;
   a first dielectric layer over the first device region and the second device region, the first dielectric layer including a recess defining a step at a transition between the first device region and the second device region;
   a second dielectric layer arranged within the recess in the first dielectric layer;
   a third dielectric layer arranged over the first dielectric layer in the first device region and over the second dielectric layer in the second device region; and
   a first contact extending through the first dielectric layer, the second dielectric layer, and the third dielectric layer in the second device region, the first contact coupled to the second field-effect transistor.

2. The structure of claim 1 wherein the third dielectric layer has a top surface that is planar in the first device region and the second device region.

3. The structure of claim 1 wherein the step has a step height that is substantially equal to a thickness of the second dielectric layer, and the third dielectric layer has a planar top surface in the first device region and the second device region.

4. The structure of claim 1 wherein the second dielectric layer has a top surface, and the first dielectric layer has a top surface in the first device region that is substantially coplanar with the top surface of the second dielectric layer.

5. The structure of claim 1 further comprising:
a fourth dielectric layer arranged over the third dielectric layer,
wherein the first contact extends through the fourth dielectric layer.

6. The structure of claim 5 wherein the fourth dielectric layer is comprised of a first dielectric material, the second dielectric layer is comprised of a second dielectric material, the third dielectric layer is comprised of a third dielectric material, and the first dielectric material is removable selective to the second dielectric material and to the third dielectric material.

7. The structure of claim 6 wherein the first dielectric material is silicon dioxide, and the second dielectric material and the third dielectric material are silicon nitride.

8. The structure of claim 1 further comprising:
a second contact extending through the first dielectric layer and the third dielectric layer in the first device region, the second contact coupled to the first field-effect transitor.

9. The structure of claim 8 wherein the first field-effect transistor has a source/drain region arranged on a device layer of a silicon-on-insulator substrate, and the second field-effect transistor has a source/drain region arranged on a substrate of the silicon-on-insulator substrate.

10. The structure of claim 9 wherein the first contact is coupled to the source/drain region of the second field-effect transistor, and the second contact is coupled to the source/drain region of the first field-effect transistor.

11. A structure comprising:
a first device structure in a first device region;
a second device structure in a second device region;
a first dielectric layer over the first device region and the second device region, the first dielectric layer including a recess defining a step at a transition between the first device region and the second device region;
a second dielectric layer arranged within the recess in the first dielectric layer;
a third dielectric layer arranged over the first dielectric layer in the first device region and over the second dielectric layer in the second device region;
a fourth dielectric layer arranged over the third dielectric layer; and
a first contact extending through the first dielectric layer, the second dielectric layer, the third dielectric layer, and the fourth dielectric layer in the second device region, the first contact coupled to the second device structure,
wherein the fourth dielectric layer is comprised of a first dielectric material, the second dielectric layer is comprised of a second dielectric material, the third dielectric layer is comprised of a third dielectric material, and the first dielectric material is removable selective to the second dielectric material and to the third dielectric material.

12. The structure of claim 11 wherein the first dielectric material is silicon dioxide, and the second dielectric material and the third dielectric material are silicon nitride.

13. The structure of claim 11 wherein the third dielectric layer has a top surface that is planar in the first device region and the second device region.

14. The structure of claim 11 wherein the step has a step height that is substantially equal to a thickness of the second dielectric layer, and the third dielectric layer has a planar top surface in the first device region and the second device region.

15. The structure of claim 11 wherein the second dielectric layer has a top surface, and the first dielectric layer has a top surface in the first device region that is substantially coplanar with the top surface of the second dielectric layer.

16. A structure comprising:
a first device structure in a first device region;
a second device structure in a second device region;
a first dielectric layer over the first device region and the second device region, the first dielectric layer including a recess defining a step at a transition between the first device region and the second device region;
a second dielectric layer arranged within the recess in the first dielectric layer;
a third dielectric layer arranged over the first dielectric layer in the first device region and over the second dielectric layer in the second device region;
a first contact extending through the first dielectric layer, the second dielectric layer, and the third dielectric layer in the second device region, the first contact coupled to the second device structure; and
a second contact extending through the first dielectric layer and the third dielectric layer in the first device region, the second contact coupled to the first device structure,
wherein the first device structure is a first field-effect transistor having a source/drain region arranged on a device layer of a silicon-on-insulator substrate, and the second device structure is a second field-effect transistor having a source/drain region arranged on a substrate of the silicon-on-insulator substrate.

17. The structure of claim 16 wherein the first contact is coupled to the source/drain region of the second field-effect transistor, and the second contact is coupled to the source/drain region of the first field-effect transistor.

18. The structure of claim 16 wherein the third dielectric layer has a top surface that is planar in the first device region and the second device region.

19. The structure of claim 16 wherein the step has a step height that is substantially equal to a thickness of the second dielectric layer, and the third dielectric layer has a planar top surface in the first device region and the second device region.

20. The structure of claim 16 wherein the second dielectric layer has a top surface, and the first dielectric layer has a top surface in the first device region that is substantially coplanar with the top surface of the second dielectric layer.

* * * * *